United States Patent
Thomas

(10) Patent No.: US 8,922,275 B2
(45) Date of Patent: *Dec. 30, 2014

(54) COMMON MODE INPUT CONTROL FOR SWITCH CAPACITOR AMPLIFIER IN PIPELINE ANALOG-TO-DIGITAL CONVERTER

(75) Inventor: Dave Thomas, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/587,703

(22) Filed: Aug. 16, 2012

(65) Prior Publication Data

US 2013/0043950 A1   Feb. 21, 2013

Related U.S. Application Data

(60) Provisional application No. 61/524,478, filed on Aug. 17, 2011.

(51) Int. Cl.
*H03F 1/02* (2006.01)
*H03F 3/45* (2006.01)
*H03M 1/10* (2006.01)
*H03M 1/16* (2006.01)

(52) U.S. Cl.
CPC ........ *H03F 3/45968* (2013.01); *H03F 3/45475* (2013.01); *H03M 1/1023* (2013.01); *H03F 2200/405* (2013.01); *H03F 2203/45101* (2013.01); *H03F 2203/45634* (2013.01); *H03F 2203/45726* (2013.01); *H03M 1/164* (2013.01)
USPC ................................................. 330/9; 330/69

(58) Field of Classification Search
USPC ............................................. 330/9, 69, 258
See application file for complete search history.

(56) References Cited

U.S. PATENT DOCUMENTS

| | | | | |
|---|---|---|---|---|
| 6,031,480 | A | * | 2/2000 | Soenen et al. ................. 341/161 |
| 6,191,648 | B1 | * | 2/2001 | Lewicki ......................... 327/554 |
| 2013/0257538 | A1 | * | 10/2013 | Thomas ......................... 330/261 |

* cited by examiner

*Primary Examiner* — Steven J Mottola
(74) *Attorney, Agent, or Firm* — McDermott Will & Emery LLP

(57) ABSTRACT

A common mode bias circuit may include a weak common mode bias generator and a common mode bias capacitance. During a first state of the common mode bias circuit, the weak common mode bias generator may be coupled to the common mode bias capacitance and may impart to them a predefined common mode signal level. During a second state of the common mode bias circuit, the common mode bias capacitance may be coupled to differential inputs of an amplifier in a manner that establishes an input common mode level for the amplifier.

8 Claims, 2 Drawing Sheets

US 8,922,275 B2

COMMON MODE INPUT CONTROL FOR SWITCH CAPACITOR AMPLIFIER IN PIPELINE ANALOG-TO-DIGITAL CONVERTER

CROSS-REFERENCE TO RELATED APPLICATION

This application is based upon and claims priority to U.S. provisional patent application 61/524,478, entitled "PROVIDING COMMON MODE INPUT CONTROL FOR SWITCH CAPACITOR AMPLIFIER IN PIPELINE ANALOG-TO-DIGITAL CONVERTER," filed Aug. 17, 2011. The entire content of this application is incorporated herein by reference.

BACKGROUND

1. Technical Field

This disclosure relates to amplifiers and, more particularly, to providing common mode input control for a capacitively-coupled amplifiers in a pipeline analog-to-digital converter (ADC).

2. Description of Related Art

Pipeline ADCs implemented on fine line CMOS processes may require amplifiers having large signal swings, as compared to the power supply, to maximize signal-to-noise ratio. These amplifiers may be differential and require a circuit to control the output common mode level, commonly referred to as common mode feedback (CMFB) circuit. In addition to output common mode control, the input common mode voltage may also be controlled.

Some of these circuits may use an Input Common Mode (ICM) bias generator to provide this control. However, the output impedance of the Input Common Mode bias generator may need to be very low to ensure fast common mode settling for the preceding stage amplifier. This may require a significant amount of additional power or an additional package pin with external bypass. Either approach may be costly.

There thus is a need to control the input common mode voltage in a way that is not as costly.

SUMMARY

A common mode bias circuit may include a weak common mode bias generator and a common mode bias capacitance. During a first state of the common mode bias circuit, the weak common mode bias generator may be coupled to the common mode bias capacitance and may impart to it a predefined common mode signal level. During a second state of the common mode bias circuit, the common mode bias capacitance may be coupled to differential inputs of an amplifier in a manner that establishes an input common mode level for the amplifier.

The common mode bias circuit may be part of a pipeline analog-to-digital converter.

A method of setting an input common mode level of a differential amplifier may include using a weak common mode bias generator and a common mode bias capacitance to establish a predefined signal level during a first state, and using the common mode bias capacitance during a second state to transfer a predefined signal level to differential inputs of the amplifier.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Figure 1:
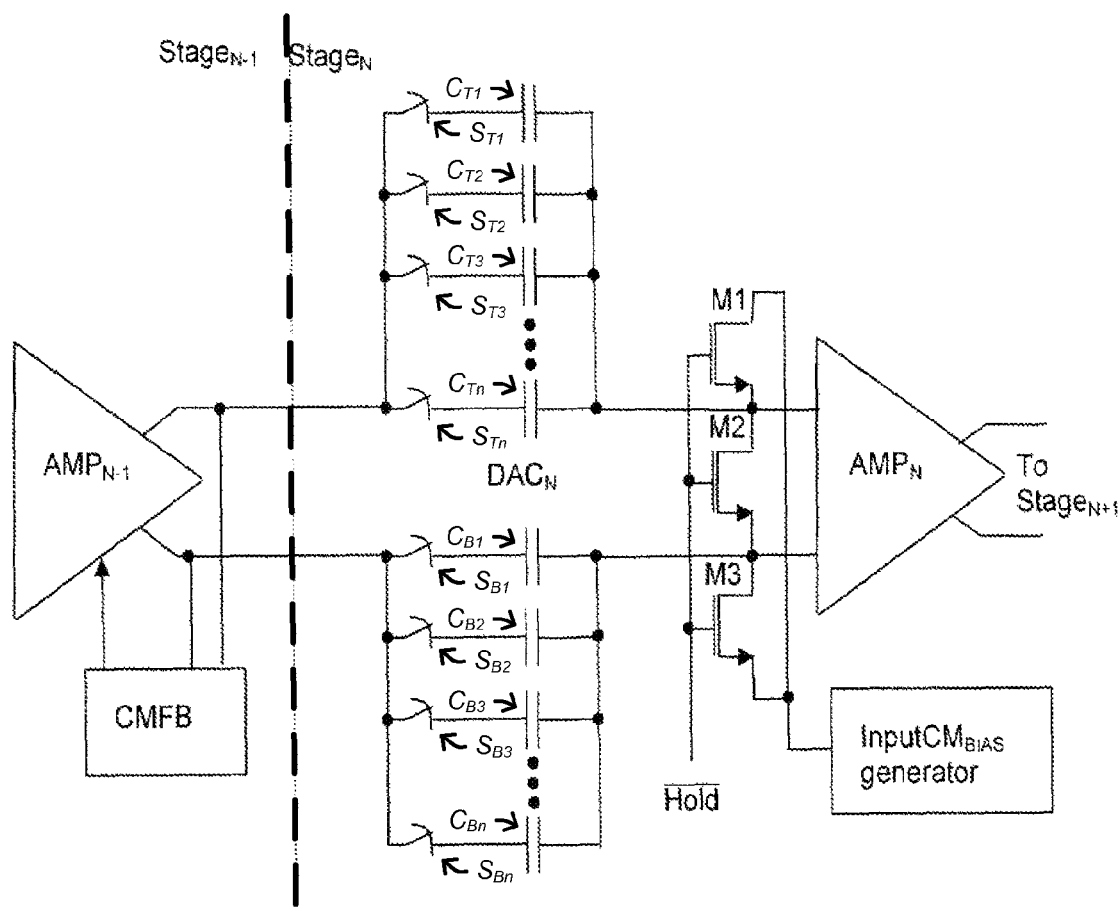
FIG. 1 illustrates an example of a prior art circuit for controlling the input common mode level of a capacitively coupled amplifier.

FIG. 1 illustrates an example of a prior art circuit for controlling the input common mode level of a capacitively coupled amplifier. The figure shows a stage n of a digital-to-analog converter $DAC_N$ in a sampling (aka acquisition) state. The $DAC_N$ may be arranged in a stage N of a pipeline ADC. The $DAC_N$ 101 may includes top capacitors $C_{T1}$, $C_{T2}$, $C_{T3}$, ..., $C_{Tn}$, bottom capacitors $C_{B1}$, $C_{B2}$, $C_{B3}$, ..., $C_{Bn}$, and sampling switches $S_{T1}$, $S_{T2}$, $S_{T3}$, ..., $S_{Tn}$, and $S_{B1}$, $S_{B2}$, $S_{B3}$, ..., $S_{Bn}$, coupled to the respective capacitors. The DAC may also have a residue (aka "hold" or "amplify") stage. There may also be references switches that operate during the DAC's residue stage (not shown for better clarity) that facilitate the hold function of the DAC.

During the $DAC_N$ sample (aka acquisition) phase, a previous stage residue (aka "hold" or "amplify") amplifier $AMP_{N-1}$ may drive the $DAC_N$ bottom capacitor plates through the sampling switches, while the top capacitor plates of the $DAC_N$ are shorted together and to a common mode bias voltage through switches M1, M2 and M3. As a result, the circuit $DAC_N$ may be both a differential and common mode load for $AMP_{N-1}$. However, the zero created by resistance in series with the $DAC_N$ capacitors may be different for the differential and common mode circuits. The differential circuit may only see the resistance of switch M2, while the common mode circuit may only see the resistance of M1 and M3 and the output impedance of an Input Common Mode (CM) bias generator.

The output impedance of the Input Common Mode bias generator may need to be very low to ensure fast common mode settling for a preceding stage amplifier (AMPN−1). This may require a significant amount of additional power or an additional package pin with external bypass. Either item may be costly.

Figure 2:
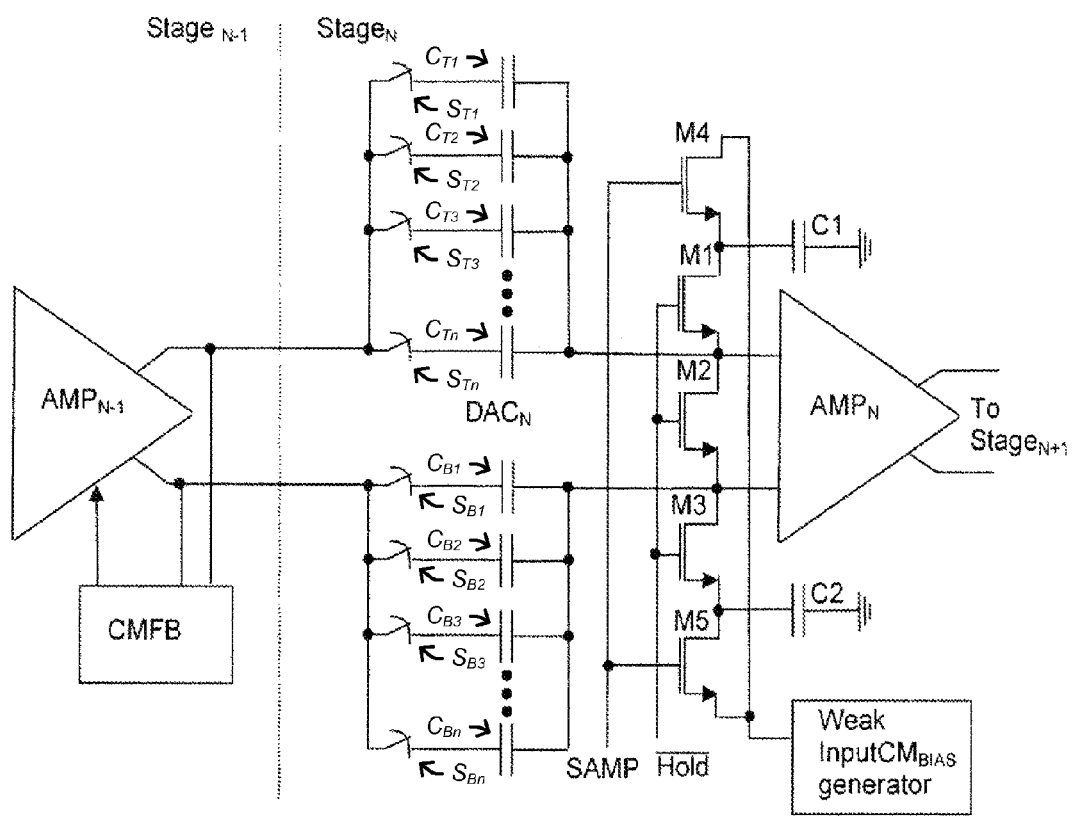
FIG. 2 illustrates an example of a circuit for setting an input common mode bias voltage using storage capacitors.

FIG. 2 illustrates an example of a circuit for setting an input common mode bias voltage using storage capacitors. This circuit may set the input common mode bias voltage with minimal power and layout area, while still allowing for fast common mode settling.

The circuit in FIG. 2 is similar to the one illustrated in FIG. 1, except that two small capacitors C1 and C2 may be added to the configuration shown in FIG. 1, along with two small switches M4 and M5.

During the amplify (aka residue or hold) phase of the $DAC_N$, switches M4 and M5 may, respectively, connect capacitors C1 and C2 to a low power (weak) input common mode (CB) bias voltage generator to acquire a desired input common mode target voltage. Then, during the $DAC_N$ acquires (aka sample) phase, M4 and M5 may be switched off and M1, M2, M3 may be switched on, transferring the common mode target voltage to $DAC_N$. The switches M4 and M5 may be control by switch control signal SAMP, and the switched M1, M2 and M3 may be controlled by switch control signal $\overline{\text{Hold}}$. The switch control signals SAMP and $\overline{\text{Hold}}$ may be non-overlapping signals provided to ensure accurate charge transfer.

In the configuration shown in FIG. 2, only M2 may be large (low resistance) for fast differential settling. The common mode load may be drastically reduced compared to the arrangement in FIG. 1 and may consist only of the small charge transfer capacitors C1 and C2 and other parasitic capacitance. This may allow for fast common mode settling, which may make the design of $AMP_{N-1}$ easier. Additionally layout area and power can be saved since the input common mode bias generator can have high output impedance.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and advantages. These also include embodiments in which the components and/or steps are arranged and/or ordered differently.

For example, the circuit in FIG. 2 sets an input common mode bias voltage. However, the concepts that it embodies may be applied to any common mode input control scheme for controlling any amplifier.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A common mode bias circuit comprising:
   a common mode bias generator; and
   a common mode bias capacitance that has a first and a second terminal;
   wherein the common mode bias circuit is configured such that:
      during a first state of the common mode bias circuit:
         the common mode bias generator is coupled to the first terminal of the common mode bias capacitance and imparts to it a predefined common mode signal level; and
         the second terminal of the common mode bias capacitance is coupled to a DC bias voltage;
      during a second state of the common mode bias circuit:
         the first terminal of the common mode bias capacitance is coupled to differential inputs of an amplifier in a manner that establishes an input common mode level for the amplifier; and
         the second terminal of the common mode bias capacitance remains coupled to the DC bias voltage; and
      the DC bias voltage remains substantially the same during the first and second states.

2. The common mode bias circuit of claim 1 wherein the common mode bias circuit is part of a pipeline analog-to-digital converter.

3. The common mode bias circuit of claim 1 wherein the common mode bias generator is a weak common mode bias generator.

4. The common mode bias circuit of claim 1 wherein:
   the common mode bias capacitance is a capacitor having a first and a second terminal;

the first terminal of the common mode capacitance is the first terminal of the capacitor; and the second terminal of the common mode capacitance is the second terminal of the capacitor.

5. The common mode bias circuit of claim 1 wherein the common mode bias circuit is part of a larger circuit that performs digital-to-analog conversion.

6. The common mode bias circuit of claim 5 wherein the common mode bias circuit has both a sample state and a hold state.

7. The common mode bias circuit of claim 6 wherein the first state is the sample state and the second state is the hold state.

8. The common mode bias circuit of claim 1 wherein:

the common mode bias capacitance is a first common mode bias capacitance and further comprising a second common mode bias capacitance that has a first and a second terminal and that is different than the first common mode bias capacitance; and the common mode bias circuit is configured such that:

during the first state of the common mode bias circuit:

the common mode bias generator is coupled to the first terminal of the second common mode capacitance and imparts to it a predefined common mode signal level; and the second terminal of the second common mode bias capacitance is coupled to a DC bias voltage; and during the second state of the common mode bias circuit:

the first terminal of the second common mode bias capacitance is coupled to the differential inputs of the amplifier in a manner that helps establish an input common mode level for the amplifier; and the second terminal of the second common mode bias capacitance remains coupled to the DC bias voltage.

* * * * *